United States Patent [19]

Takahashi

[11] Patent Number: 5,577,062
[45] Date of Patent: Nov. 19, 1996

[54] SEMICONDUCTOR LASER DIODE APPARATUS AND METHOD OF PRODUCING THE SAME

[75] Inventor: Takashi Takahashi, Sendai, Japan

[73] Assignee: Ricoh Company, Ltd., Tokyo, Japan

[21] Appl. No.: 361,102

[22] Filed: Dec. 21, 1994

[30] Foreign Application Priority Data

Dec. 22, 1993 [JP] Japan .................... 5-324037

[51] Int. Cl.$^6$ .................................................. H01S 3/19
[52] U.S. Cl. .................. 372/46; 372/45; 437/129
[58] Field of Search .................. 372/46, 45; 437/129

[56] References Cited

U.S. PATENT DOCUMENTS

| | | | |
|---|---|---|---|
| 4,712,219 | 12/1987 | Yano et al. | 372/46 |
| 4,829,023 | 5/1989 | Nagai et al. | 437/129 |
| 5,114,877 | 5/1992 | Paoli et al. | 437/129 |
| 5,173,913 | 12/1992 | Kaneno | 372/45 |

FOREIGN PATENT DOCUMENTS

| | | | |
|---|---|---|---|
| 61-281575 | 12/1986 | Japan | 372/46 |
| 3-62585 | 3/1991 | Japan | 372/45 |

*Primary Examiner*—Rodney B. Bovernick
*Assistant Examiner*—Yisun Song
*Attorney, Agent, or Firm*—Cooper & Dunham LLP

[57] ABSTRACT

A semiconductor laser diode apparatus has a substrate of a first conduction type, a first clad layer of the first conduction type which is formed on the substrate, a current block layer which is formed on the first clad layer, a V groove stripe which is formed in a vertical direction so that a tip of the V groove can arrive at the first clad layer in depth, an active layer which is formed on the first clad layer and the current block layer along the V groove stripe without a low resistrance layer, a second clad layer of a second conduction type which is formed on the active layer, a contact layer of the second conduction type which is formed on the second clad layer, a first electrode which is formed on a surface of the substrate which is reverse side of a surface on which the first clad layer is formed and a second electrode which is formed on a surface of the contact layer. Therefore a low threshold current level can be achieved.

13 Claims, 6 Drawing Sheets

5,577,062

SEMICONDUCTOR LASER DIODE APPARATUS AND METHOD OF PRODUCING THE SAME

BACKGROUND OF THE INVENTION

1. Field of the Invention

The present invention relates to a semiconductor laser diode and a method of producing the same. The invention particularly relates to a semiconductor laser diode which operates at a low threshold current level and a method of producing the same of vapor phase epitaxy (VPE) method by which a layer of higher uniformity is formed and a thin film is controlled better.

2. Discussion of the Related Art

FIG. 9 shows a conventional semiconductor laser diode which is published in Electronic Let. in 1981. In this semiconductor laser diode, a current block layer 2 of p-type InP is formed on a substrate 1 of n-type InP. The current block layer 2 and the substrate 1 are removed by chemical etching in the vertical direction so that a tip of a V groove can arrive at a surface of the substrate 1. As a result, the V groove 3 is formed and a crystal surface is exposed. Also, a clad layer-4 of n-type InP and an active layer 5 of p-type GaInAsP are formed on the current block layer 2 and at the bottom of the V groove 3, and a clad layer 6 of p-type InP is formed thereon. Moreover, a contact layer 7 of p-type GaInAsP is formed on the clad layer 6 and electrodes 8 and 9 are formed on the each surface of the contact layer 7 and the substrate 1.

In this semiconductor diode, the active layer 5 is buried in the groove 3, and a current concentrates to the active layer 5 of the groove 3 by pn reverse bias junction formed on the both sides of the groove 3. Therefore this semiconductor operates at a low threshold current level of 8–20 mA.

Furthermore, a SBA (Self aligned laser with Bent Active layer) laser is another conventional semiconductor laser diode is produced by MOVPE method. FIG. 10 shows a laser diode which is published in the spring syposium of applied physics society in 1985. In this SBA laser, a first clad layer 11 of p-type AlGaAs and a current block layer 12 of n-type GaAs are formed on a substrate 10 of p-type GaAs. A groove 13 of which a section is a reverse trapezoid is formed in this current block layer 12 and then the first clad layer 11 is exposed at the bottom of this groove 13. A second clad layer 14 of p-type AlGaAs, an active layer 15 of p-type, n-type or undoped AlGaAs, a clad layer 16 of n-type AlGaAs and a contact layer 17 of n-type GaAs are formed on the first clad layer 11 and the current block layer 12. Electrodes 18 and 19 are formed on the each surface of the contact layer 17 and the substrate 11.

In this SBA laser diode, a current flows through an opening portion of the stripe portion 13 of the current block layer 12. In the active layer 15, a portion 20 which is above the opening portion of the groove 13 is an active portion. Also, by MOVPE method, the active layer 15 can be flexed to be a near form of groove 13. In this flexed portion, the difference of refractive index in the horizontal direction occurs and optical confinement in this direction can be achieved.

In the semiconductor laser diode shown in FIG. 9, as the active layer 5 is buried in the B groove 3, LPE method is used as a second growth method after forming the V groove 3. However, in LPE method, it is difficult to form a thin film and a thickness of a layer uniformly.

In the SBA laser shown in FIG. 10, current blocking is executed by pnpn-type reverse bias junction of the first clad layer 11, the current block layer 12, the second clad layer 14 and the clad layer 16, outside the groove 13 of reverse trapezoid. The second clad layer 14 requires enough thickness of approximate 1 μm so that a depletion layer cannot spread in whole layers and a punch through cannot occur when impressing reverse bias voltage. Moreover, as a carrier density of the second clad layer 14 is raised to approximate $10^{18}/cm^3$ so that it can be effective as a clad layer, a current spreads in the second clad 14 in the parallel direction to a junction plane. Therefore a problem that the laser diode cannot operate at a low current threshold level occurs.

SUMMARY OF THE INVENTION

It is a first object of the present invention to provide a semiconductor laser diode which operates at a low threshold current level.

It is another object of the present invention to provide a method of producing a semiconductor laser diode of VPE method by which a layer of higher uniformity is formed and a thin film is controlled better.

These and other objects and advantages are achieved by the present invention which provides for a semiconductor laser diode comprising a substrate of a first conduction type, a first clad layer of the first conduction type which is formed on the substrate, a current block layer which is formed on the first clad layer, a V groove stripe which is formed in a vertical direction so that a tip of the V groove can arrive at the first clad layer in depth, an active layer which is formed on the first clad layer and the current block layer along the V groove stripe without a low resistrance layer, a second clad layer of a second conduction type which is formed on the active layer, a contact layer of the second conduction type which is formed on the second clad layer, a first electrode which is formed on a surface of the substrate which is reverse side of a surface on which the first clad layer is formed and a second electrode which is formed on a surface of the contact layer.

BRIEF DESCRIPTION OF THE DRAWINGS

In describing preferred embodiment of the present invention illustrated in the drawings, specified terminology is employed for the sake of clarity. However, the invention is not intended to be limited to the specific terminology so selected, and it is to be understood that each specific element includes all technical equivalents which operate in a similar purpose.

A more complete appreciation of the invention and many of the attendant advantages thereof will be readily obtained as the same becames better understood by reference to the following detailed description when considered in connection with the accompanying drawings, wherein.

DETAILED DESCRIPTION OF THE PREFERRED EMBODIMENT

Referring now to figures, embodiments of the invention will be described.

Figure 1:
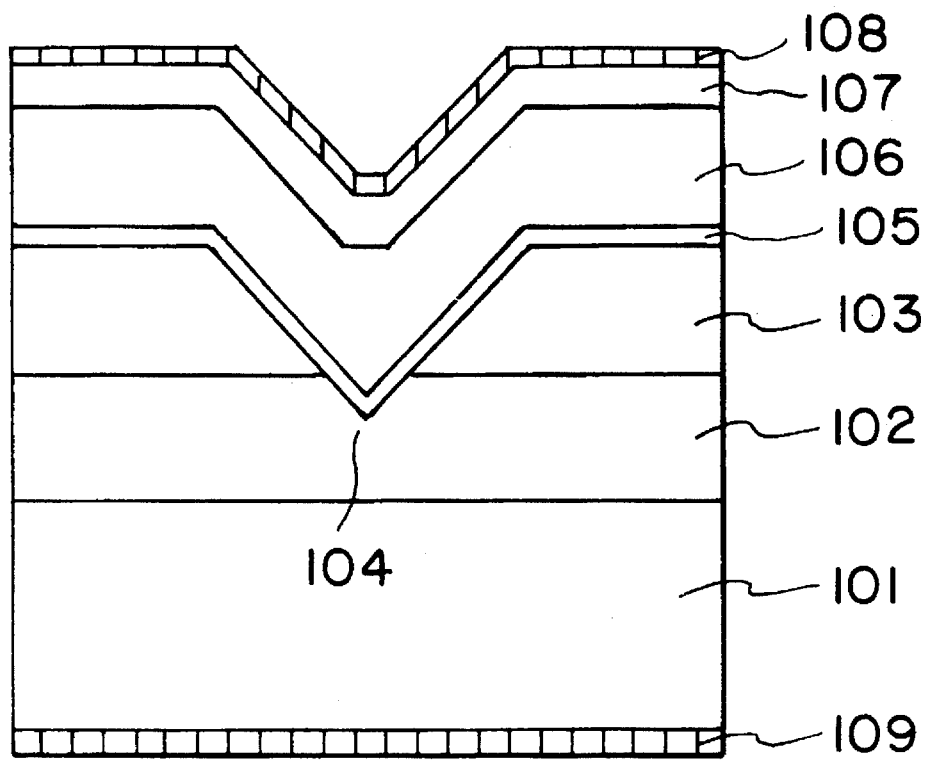
FIG. 1 is a sectional view showing a semiconductor laser diode of a first embodiment of the present invention.

Referring to FIG. 1, a first embodiment will be described. A clad layer 102 of a first conduction-type, for example n-type $Al_xGa_{1-x}As$ is formed on a substrate 101 of n-type GaAs. For example, X is 0.35 which is positive value and the clad layer 102 is $Al_{0.35}Ga_{0.65}As$. A current block layer 103 of n-type $Al_wGa_{1-w}As$ is formed on the clad layer 102. For example, W is 0.4 which is positive value and this clad layer 103 is undoped n-type $Al_{0.4}Ga_{0.6}As$.

The clad layer 102 and the current block layer 103 are removed by etching in the vertical direction of an edge plane of a resonator so that a tip of a V groove can arrives at the clad layer 102 and then the V groove stripe 104 is formed. An active layer 105 of Al Ga As is formed along the V groove stripe 104 on the current block layer 103 and the clad layer 102.

There is not a low resistance layer between them. For example, Z is 0 and the active layer 105 is GaAs. A clad layer 106 of a second conduction type (p-type) $Al_yGa_{1-y}As$ and a contact layer 107 of p-type GaAs are formed on the active layer 105. For example Y is 0.35 and the clad layer is $Al_{0.35}Ga_{0.65}As$. An electrode 108 which corresponds to p-type is formed on the contact layer 107 and an electrode 109 which corresponds to n-type is formed on a surface of the substrate 101 which is a reverse side of a surface on which a clad layer 102 is formed. X is equal to or greater than A, Y is equal to or greater than Z and W is equal to or greater than Z.

FIG. 2(a)–(d) show producing process of the semiconductor laser diode of the first embodiment. First, as shown in FIG. 2(a, the clad layer 102 of n-type $Al_{0.35}Ga_{0.65}As$ and the current block layer 103 of undoped n-type $Al_{0.4}Ga_{0.6}As$ are formed on a substrate 101 of n-type GaAs by a vapor phase epitaxy method (VPE) as an epitaxial growth method. In this case, the clad layer 102, the current block layer 103 are formed by low pressure MOVPE method as VPE method. The thickness of the clad layer 102 is 1.5 μm, that of the current block layer 103 is 1.0 μm. The current block layer 103 of undope n-type $Al_{0.4}Ga_{0.6}As$ is formed at a lower temperature of under 700° C. and a ratio between material of III group and that of V group is controlled. As a result, a resistivity of approximate $10^6 \Omega.cm$ can be achieved.

Figure 2A:
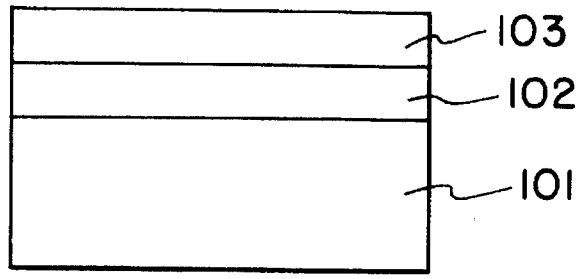
FIGS. 2(a) to 2(b) show a producing process of a semiconductor laser diode of a first embodiment of the present invention.
Figure 2B:
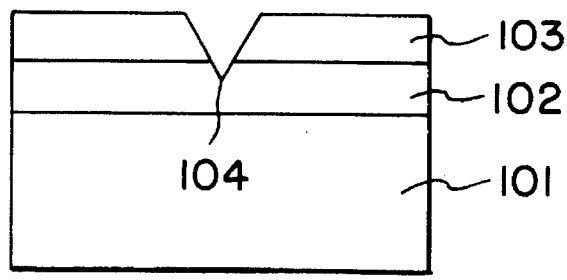
Figure 2C:
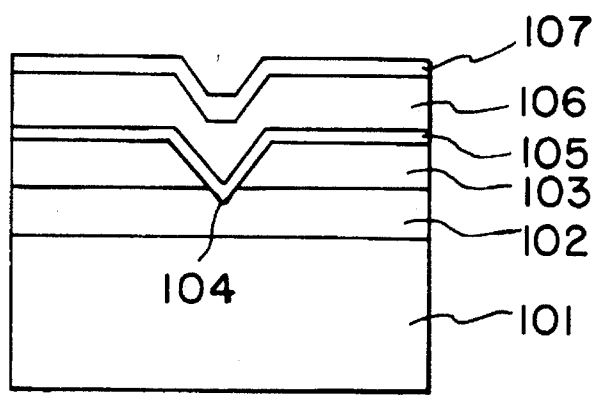

Next, as shown in FIG. 2(b), the V groove stripe 104 is formed by wet-etching in which a photoresist is used as a mask, and a crystal surface is exposed. The depth is 1.2 μm so that a tip of this V groove stripe 104 can arrive at the second clad layer 102. A crystal plane of the substrate 101 is (100), and that of the V groove stripe 104 is (011). $H_2SO_4:H_2O_2:H_2O$ (1:8:40) is used as a etchant.

Figure 2D:
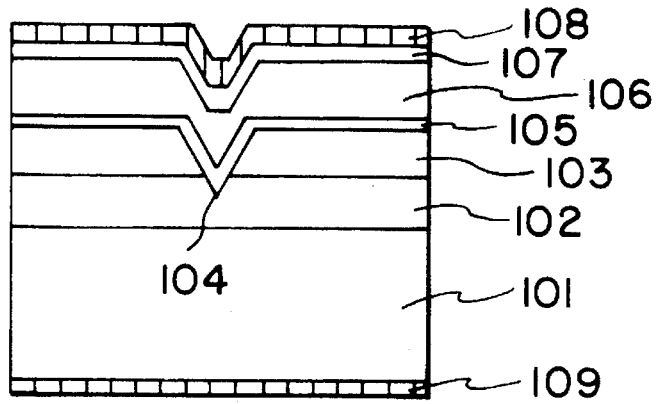

After the V groove stripe is formed, as shown in FIG. (c), the active layer 105 of GaAs, the clad layer of p-type $Al_{0.35}Ga_{0.65}As$ and the contact layer 107 of p-type GaAs are formed on the current block layer 102 and the clad layer 102 by the VPE method. This second VPE method is executed by the low pressure MOVPE method. Therefore the active layer 105 is fixed along the V groove stripe 104. The thickness of the active layer 105 is 0.1 μm, that of the clad layer 106 is 1.5 μm and that of the contact layer 107 is 0.2 μm. Finally, as shown in FIG. 2(d), the p-type electrode 108 is formed on the surface of the contact layer 107 and the n-type electrode 108 is formed on the reverse surface of the substrate 101 by a vacuum evaporation method.

Next, an operation of the first embodiment will be described. As the current block 103 of undoped n-type $Al_{0.4}Ga_{0.6}As$ which has high resistance is formed outside the V groove stripe 104, it is more difficult for a current to flow and it concenrates to the V groove stripe 104. Then a light emits at the active layer 105 and it outputs to outside through the active layer 105. However, in the conventional laser diodes, as a low resistance layer, for example the second clad layer, is between the current block layer and the active layer, a current which was made narrow spreads in the horizontal direction. Therefore the current does not concentrate to the portion of the active layer which corresponds to the bottom of the V groove. On the other hand, in the first embodiment, as the active layer 105 joins to the V groove stripe 104 directly without the low resistance layer, it can be achieved that the current concentrates to the portion of the active layer which corresponds to the bottom of the V groove 104 and it can be prevented that the current spreads in the horizotal direction.

Moreover, the refractive index of the current block layer 103 of undoped n-type $Al_{0.4}Ga_{0.6}As$ is lower than that of the active layer of GaAs. Therefore, the difference of the refractive index in the horizontal direction occurs in the portion of the active layer 105 which corresponds to the bottom of the V groove 104 and the portion functions as a light waveguide. In this way, as the V groove stripe functions as both a light waveguide and a current path, optical confinement and current confinement are executed with self-matching and laser lateral transverse mode becomes stable. Also, as the current block layer 103 which is formed at the both sides of the V groove stripe 104, is formed from undoped n-type $Al_{0.4}Ga_{0.6}As$ of high resistivity, the current can be confined effectively.

Furthermore, the active layer 105 is formed along the V groove and the form is suitable to the VPE method. Therefore the active layer 105, the clad layer 106 and the contact layer 107 are formed by VPE method. As a result, it is better to control a thin film and to form a layer uniformly by VPE method than by LPE method.

Figure 3:
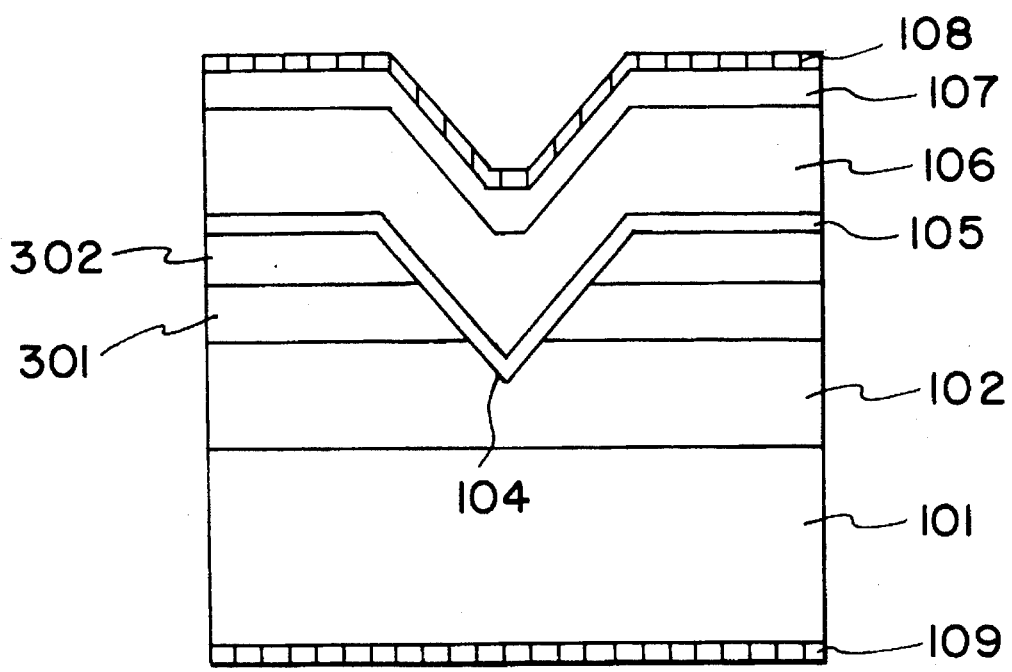
FIG. 3 is a sectional view showing a semiconductor laser diode of a second embodiment of the present invention.

FIG. 3 shows a second embodiment. The point in the second embodiment which is different from in the first embodiment, is that the current block 103 is composed of a layer 301 of p-type $Al_{w'}Ga_{1-w'}As$ and a layer 302 of n-type $Al_{w''}Ga_{1-w''}As$ instead of n-type Al Ga As. W' and W'' which are positive value are greater than Z. For example W' and W'' are 0.4 and the layers 301 is p-type $Al_{0.4}Ga_{0.6}As$ and the layers 302 is n-type $Al_{0.4}Ga_{0.6}As$. The thicknesses of the layers 301 and 302 are 1.0 μm repetively. Therefore the both sides of the V groove stripe 104 are pnpn junction structure and both a hole and an electron are blocked by the reverse bias junction. As a result, a current can concentrate to the V groove stripe 104 and it can confine effectively.

Figure 4:
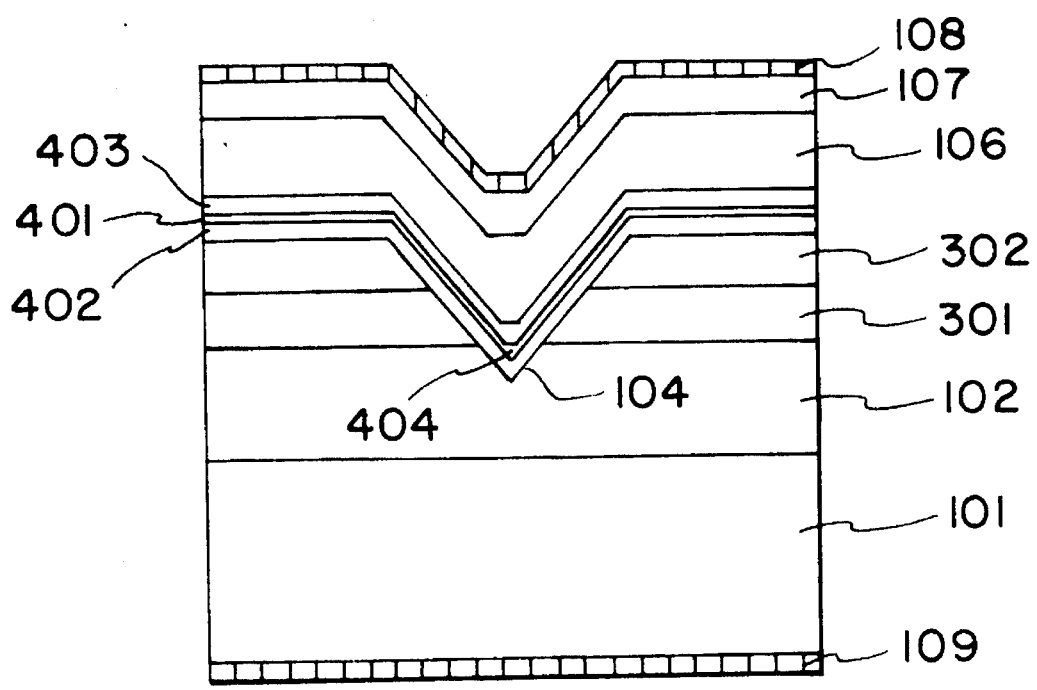
FIG. 4 is a sectional view showing a semiconductor laser diode of a third embodiment of the present invention.

FIG. 4 shows a third embodiment. The point in the third embodiment which is different from in the second embodiment, is that the active layer 105 is thinner and it has a quantum well structure 401 and light waveguide layers 402 and 403 of undoped $Al_{0.15}Ga_{0.85}As$ are formed adjacent to the active layer 401, at the each side of the substrate 101 and the p-type contact layer 107. The thickness of the quantum well layer 401 is 150–200Å, and those of the light waveguide layers 402 and 402 are 0.15 μm. The light waveguide layers functions as a barrier layer to the quantum well structure.

Next, an operation of the third embodiment will be described. In SCH structure which is that the light waveguide layers 402 and 403 are formed adjacent to the active layer 401, as an area of optical confinement is separate from an area of current confinement even if the active layer is thin, a threshold current level is not raised.

When the active layer 401 is the quantum well structure, the threshold current level can be lower than that of a double hetero structure. Especially, the form of the active layer 401 is flexed along the V groove stripe 104 and the portion 404 of the quantum well active layer which corresponds to the bottom of the V groove stripe 104 is triangle which is surrounded by barrier layers. Therefore, the active layer 401 functions not only as a one dimension quantum well, but also a carrier is confined in the horizontal direction. As a result, an effect of a quantum wire structure occurs and also the threshold current level can be reduced.

The carrier is confined in the quantum well layer 401, and on the other hand the light is confined in the light waveguide layers 402 and 403. Moreover, the light waveguide layer 402 which is formed on the side of the substrate 101, is formed between the quantum well layer 401 and the surface of the V groove stripe 104 which was exposed to air after echting. Therefore the light waveguide layer 402 functions as a buffer layer and it prevents crystal characteristic of the active layer from decreasing.

Though the light waveguide layer 402 is formed between the active layer 401 and the current block layer 103, the thickness is thin, which is 0.15 μm, and the density of the carrier is low, which is $10^{18}/cm^3$. Therefore the problem of the current spreading does not occur.

In this embodiment, though the light waveguide layers are formed on the both sides of the active layer 401, the light waveguide layer can be formed on its one side.

Figure 5:
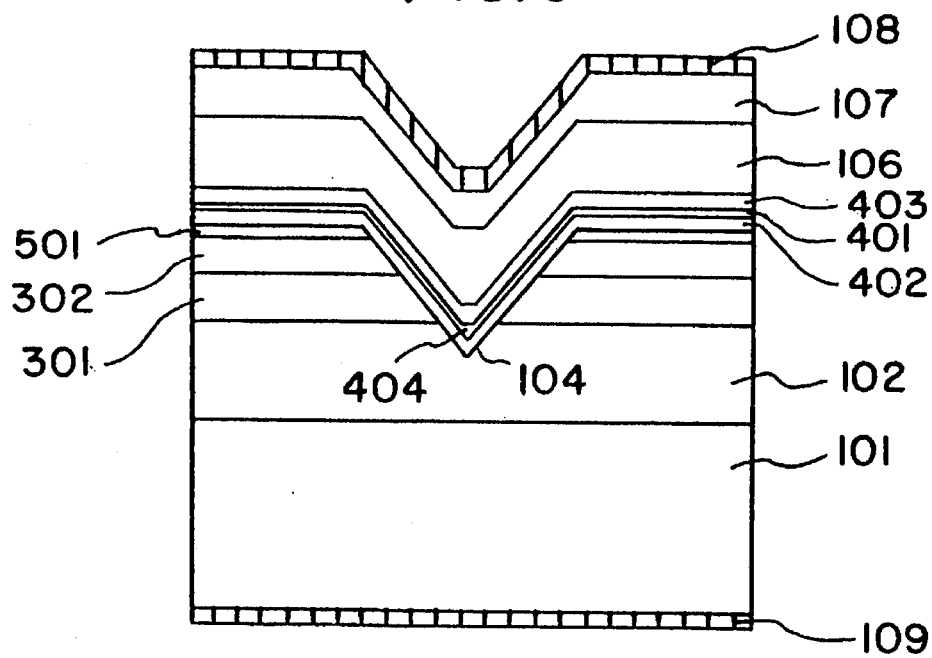
FIG. 5 is a sectional view showing a semiconductor laser diode of a forth embodiment of the present invention.

FIG. 5 shows a forth embodiment. The point in the forth embodiment which is different form in the third embodiment, is that a cap layer 501 of p-type GaAs is formed on the surface of the current block layer 302 of n-type $Al_{0.4}Ga_{0.6}As$ when the first growth is executed by the VPE method. The thickness of this cap layer 501 is 0.1 μm. During process of producing in the forth embodiment, the layer which is formed finally by the growth is exposed to air. Therefore the cap layer 501 is formed thereon, and it prevents the surface of the current block layer 302 of high oxidizable material from being oxidized.

Also, the cap layer 501 can be formed from n-type or undoped GaAs instead of p-type GaAs.

In this embodiment, a dry etching is done in the chamber in a MOVPE equipment before the second growth by the VPE method.

By this process, a oxidized film, which is formed on the surfaces of the current block layers 301 and 302 of the n-type AlGaAs and the clad layer 102 of n-type AlGaAs which are exposed to air, can be removed. Therefore the second growth by the VPE method including the active layer can be achieved without reducing quality of crystal.

Figure 6:
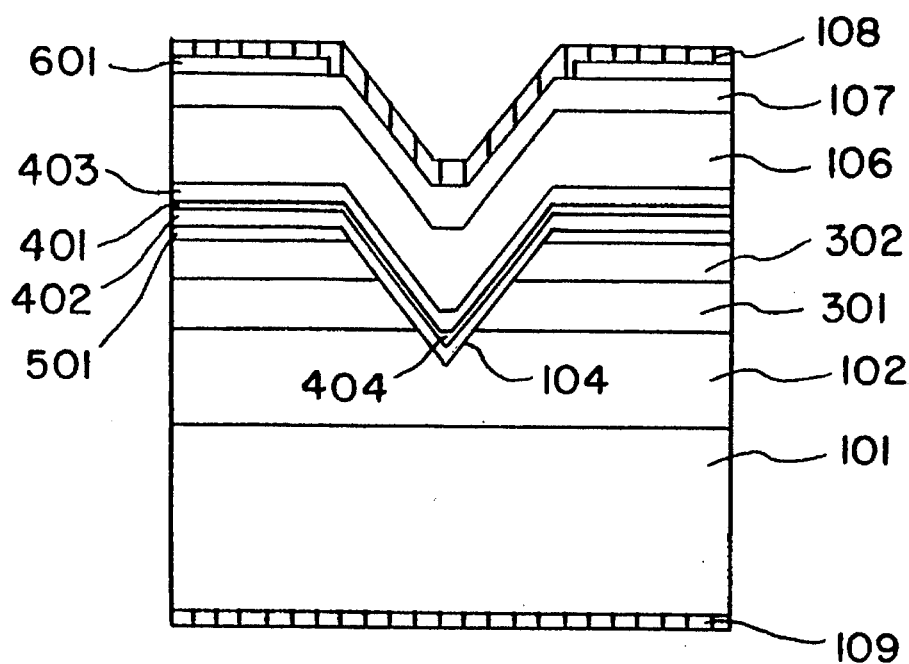
FIG. 6 is a sectional view showing a semiconductor laser diode of a fifth embodiment of the present invention.

FIG. 6 shows a fifth embodiment. The point in the fifth embodiment which is different from in the forth embodiment, is that a insulation layer 601 of silicon oxide is formed between the p-type electrode and the contact layer 107, and it is formed above the portion where the V groove stripe 104 is not formed. In this embodiment, the insulation layer 601 of silicon oxide is formed by plasma CVD method after the second growth to be 2500 Å in thickness. Next, in the insulation layer 601, the portion which corresponds to the above of the V groove stripe 104 is removed by etching of hydrofluoric acid buffer solution, in which a resist is used as a mask. After that, evaporation is executed on p-type electrode 108.

Next, an operation will be described. In this embodiment, a current is confined by forming the current block layer 301 and 302. If a crystal defect which extends in the vertical direction exists in the layers, a leak current flows between the p-type electrode 108 and the n-type electrode 109 through this crystal defect and it causes an operation problem. However, as the insulation layer 601 is formed above the portion where the V groove stripe 104 is not formed, a current can be confined around the V groove stripe 104 in the p-type contact layer 107 and the p-type clad layer 106. Therefore even if the crystal defect exists apart from the V groove stripe 104, the current leak cannot occur and a normal operation can be achieved.

Figure 7:
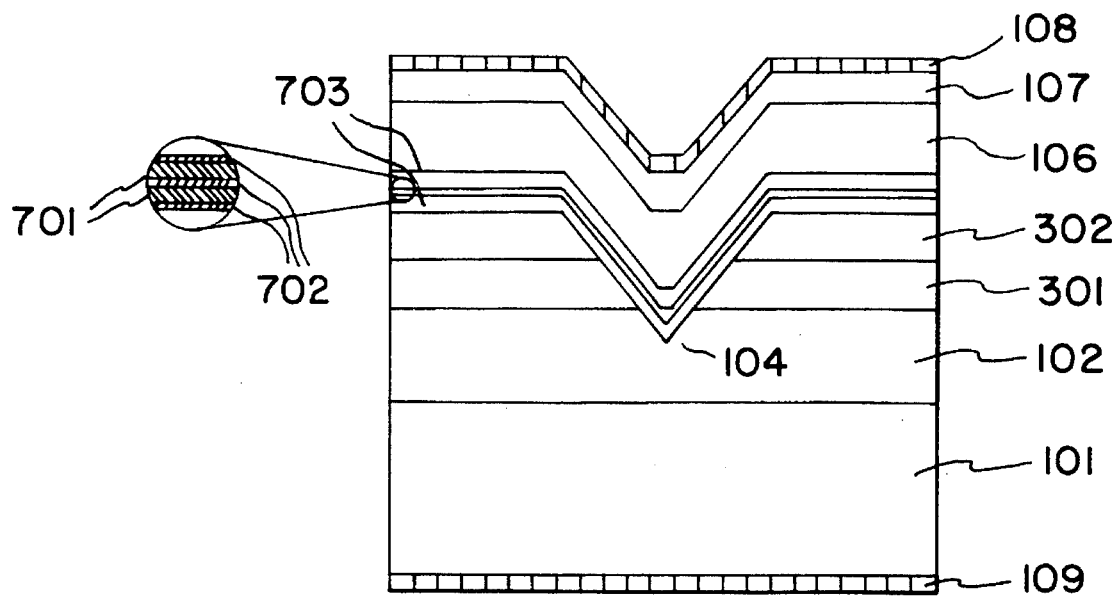
FIG. 7 is a sectional view showing a semiconductor laser diode of a sixth embodiment of the present invention.

FIG. 7 shows a sixth embodiment. The point in the sixth embodiment which is different from in the three embodiment, is that two well layers 701 of $In_{0.2}Ga_{0.8}As$ which has a little lattice mismatching and three barrier layers 702 of GaAs are formed alternately and light waveguide layers 703 of $Al_pGa_{1-p}As$ (p=0–0.35) GRIN structure are on its both sides. The thickness of the each well layer 701 is thin, which is 80Å and under a critical thickness of film. In the well layer 701 of $In_{0.2}Ga_{0.8}As$, a band structure is changed into a strained quantum well structure by compressive stains. Therefore hole confinement effect in this case is better than in the case that strain does not exist and the threshold current level can be reduced more.

Figure 8:
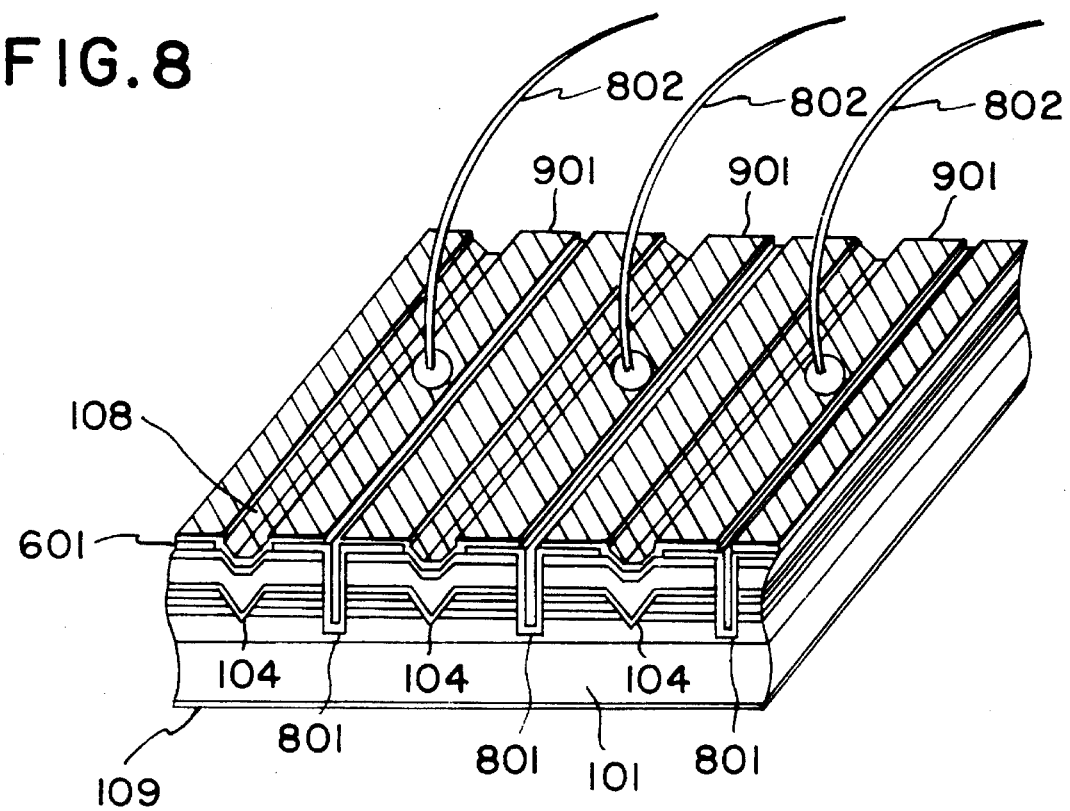
FIG. 8 is a sectional view showing a semiconductor laser diode of a seventh embodiment of the present invention.
Figure 9:
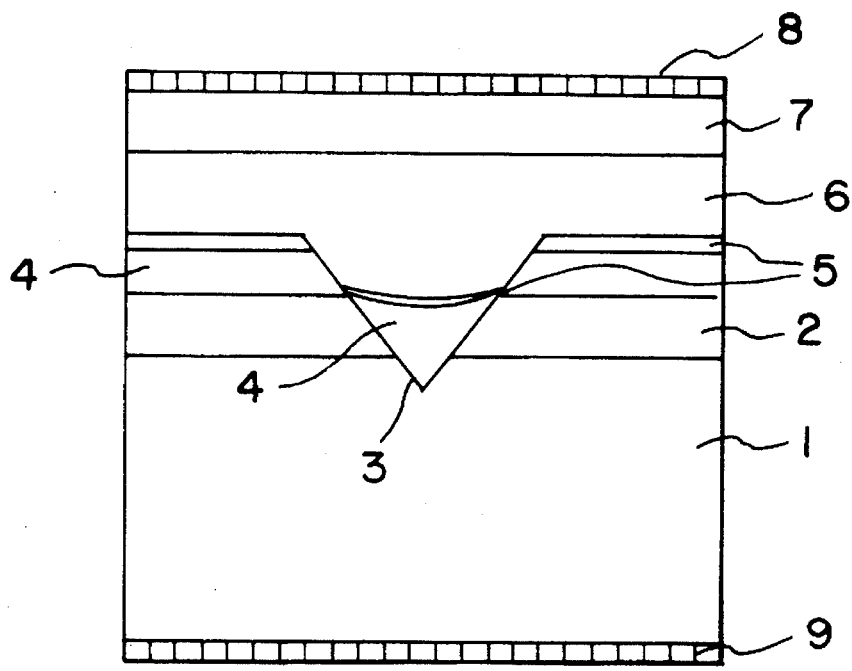
FIG. 9 is a sectional view showing a conventional semiconductor laser diode.
Figure 10:
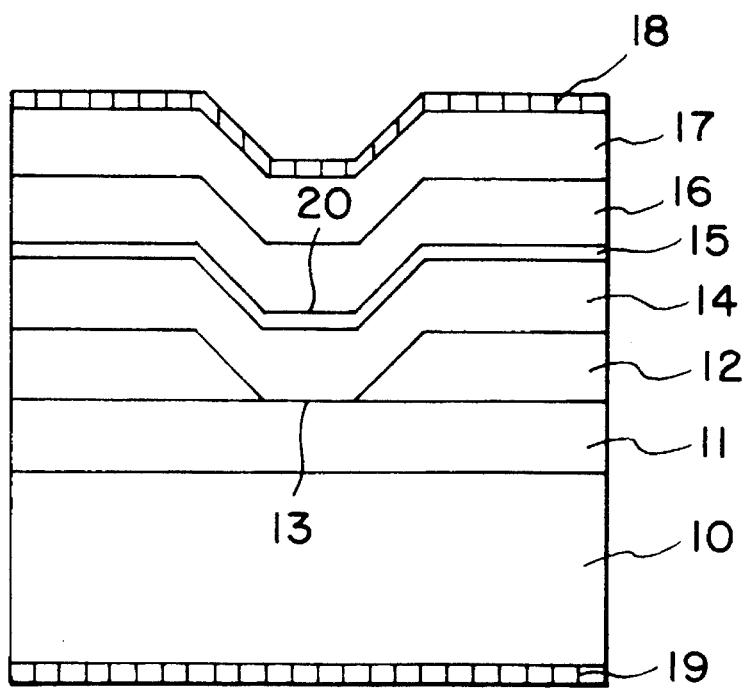
FIG. 10 is a sectional view showing another conventional semiconductor laser diode.

FIG. 8 shows a seventh embodiment. The semiconductor laser diodes 901 of the fifth embodiment are arranged on the substrate 101 in the horizontal direction. Each semiconductor laser diode 901 is separate electronically one another by trenches which arrive at the n-type clad layer 102 in depth. P-type electrode 108 is connected to a driver circuit for driving layer diode which is not shown in FIG. 8 by the bonding wires 802. Each laser diode is drived independently by drive and it can apply to an optical source array for optical transmission of multi-channel.

In those embodiments, though a n-type substrate is used, a p-type substrate can be used. In that case, a conductive type in each layer by the VPE method is changed, for example n-type is changed into p-type. Moreover, this invention cannot limit to a laser diode of GaAs/AlGaAs but it can apply to a laser diode of InP/InGaAsP.

Finally, the technical advantage will be described.

According to the first embodiment, as the active layer is formed on the V groove stripe without the layer of low resistively, the current can concentrate to a portion in the active layer which corresponds to the bottom of the V groove stripe layer and current spreading in the horizontal direction can be reduced. Moreover, as the active layer, the second clad layer and the contact layer are formed by the VPE method, it is better to control a thin film and to form a layer uniformly by the VPE method than by LPE method. Further, as the current block layer is formed from high resistance of $Al_wGa_{1-w}As$, the current can be confined effectively.

According to the second embodiment, as the second conductive type $Al_wGa_{1-w}As$ and the first conductive type $Al_{w''}Ga_{1-w''}As$ are formed as the current block layer, the current can be confined effitively.

According to the third embodiment, as the light confinement layer is formed adjacent the active layer at least on its one side, the area of optical confinement can be separate from the area of current confinement and the threshold current level cannot be raised even if the active layer is thin.

Further, the optical confinement layer is formed between the active layer and the V groove stripe which was exposed to air functions as the buffer layer and therefore it prevents the active layer from decreasing cyrstal characteristic.

Moreover, the active layer is the quantum well structure, the portion in the active layer which corresponds to the bottom of the V groove stripe, functions as the quantum wire structure and the threshold current level can be reduced more.

According to the fourth embodiment, as the cap layer of n-type, p-type or undoped GaAs is formed on the surface of the current block layer, the surface of the current block layer can be prevented from being oxidized. Moreover, as the process of dry etching in a chamber is included before the second growth, the oxidized film on the surface of the current block layer and the clad layer which was exposed to air can be removed, the second growth by the VPE method including the active layer can be executed without reducing quality of crystal.

According to the fifth embodiment, as the insulation layer is formed between a contact layer and a second electrode and it is formed above the portion where the V groove stripe is not formed, even if the crystal defect exists apart from the V groove stripe, the current leak does not occur and the normal operation can be achieved.

According to the sixth embodiment, as a active layer is the strain quantum well structure, the hole confinement effect in this case is better than in the case that strain does not exist and the threshold current level can be reduced more.

According to the seventh embodiment, as the semiconductor laser diodes are arranged on the substrate in the horizontal direction, each electrode of the each semiconductor laser diode is separate electronically one another and the each laser diode is drived independently by the driver, it can apply to an optical source array for optical transmission of multi-channel.

Obviously, numerous modifications and variations of the present invention are possible in the above teachings. It is therefore to be understood that, within the scope of the appended claims, the invention may be practiced otherwise than as specifically described herein.

What is claimed as New and Desired to be Secured by Letters Patent of the United State is:

1. A semiconductor laser diode apparatus comprising:
    a substrate of a first conduction type;
    a first clad layer of the first conduction type which is formed on the substrate;
    a current block layer which is formed on the first clad layer;
    a V groove stripe which is formed in a vertical direction so that a stripe of the V groove can arrive at the first clad layer in depth;
    an active layer which is formed on the first clad layer and the current block layer along the V groove stripe without a low resistrance layer;
    a second clad layer of a second conduction type which is formed on the active layer;
    a contact layer of the second conduction type which is formed on the second clad layer;
    a first electrode which is formed on a surface of the substrate which is reverse side of a surface on which the first clad layer is formed;
    a second electrode which is formed on a surface of the contact layer.

2. The semiconductor laser diode apparatus of claim 1, where the current block layer is $Al_wGa_{1-w}As$ of high resistance.

3. The semiconductor laser diode apparatus of claim 1, wherein a refractive index of the active layer is higher than that of the current block layer.

4. The semiconductor laser diode apparatus of claim 1, wherein the current block layer comprises a layer of the second conduction type $Al_wGa_{1-w}As$ and a layer of the first conduction type $Al_{w'}Ga_{1-w'}As$ which are formed in that order form the side of the substrate.

5. The semiconductor laser diode apparatus of claim 1, further comprising a cap layer of n-type, p-type or undoped GaAs which is formed on the surface of the current block layer.

6. The semiconductor laser diode apparatus of claim 1, further comprising at least an optical confinement layer which is formed adjacent to the active layer at the side of the substrate.

7. The semiconductor laser diode apparatus of claim 6, wherein the active layer is a quantum well structure.

8. The semiconductor laser diode apparatus of claim 7, wherein the active layer is a strained quantum well structure.

9. The semiconductor laser diode apparatus of claim 1, further comprising an insulation layer which is formed between the contact layer and the second electrode and is formed above the portion where the V groove stripe is not formed.

10. The semiconductor laser diode apparatus of claim 1, wherein a plurality of said semiconductor laser diodes are arranged on the substrate in the horizontal direction and are separate to one another electrically so that the each laser diode can operate independently.

11. A method of producing a semiconductor laser diode comprising steps of:
    forming a first clad layer of a first conduction type on a substrate of the first conduction type by a vapor phase epitaxy method;
    forming a current block layer on the first clad layer by the vapor phase epitaxy method;
    forming a V groove stripe in a vertical direction so that a tip of the V groove can arrive at the first clad layer in depth by wet-etching;
    forming an active layer on the first clad layer and the current block layer along the V groove stripe by the vapor phase epitaxy method;
    forming a second clad layer of a second conduction type on the active layer by the vapor phase epitaxy method;
    forming a contact layer of the second conduction type on the second clad layer by the vapor phase epitaxy method;
    forming a first electrode on a surface of the substrate which is reverse side of a surface on which the first clad layer is formed by a vacuum evaporation method;
    forming a second electrode on a surface of the contact layer by the vacuum evaporation method.

12. The method of producing a semiconductor laser diode of claim 11, wherein the vapor phase epitaxy method is a low pressure MOVPE method.

13. The method of producing a semiconductor laser diode of claim 11, further comprising step of dry-etching in a chamber between the step of forming the V groove stripe and the step of forming the active layer.

* * * * *